United States Patent
Torazzina et al.

(10) Patent No.: US 9,404,951 B2
(45) Date of Patent: Aug. 2, 2016

(54) METHOD OF DISCRIMINATION OF A DEVICE AS POWERABLE THROUGH A LAN LINE AND DEVICE FOR ESTIMATING ELECTRIC PARAMETERS OF A LAN LINE

(71) Applicant: STMICROELECTRONICS S.R.L., Agrate Brianza (IT)

(72) Inventors: Aldo Torazzina, Biassono (IT); Riccardo Russo, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 651 days.

(21) Appl. No.: 13/736,309

(22) Filed: Jan. 8, 2013

(65) Prior Publication Data
US 2013/0120008 A1  May 16, 2013

Related U.S. Application Data

(60) Division of application No. 12/614,211, filed on Nov. 6, 2009, now Pat. No. 8,358,138, which is a continuation of application No. PCT/IT2007/000338, filed on May 8, 2007.

(51) Int. Cl.
| | |
|---|---|
| *G01R 27/08* | (2006.01) |
| *G01R 31/08* | (2006.01) |
| *G06F 1/00* | (2006.01) |
| *H04L 12/10* | (2006.01) |
| *G06F 1/26* | (2006.01) |

(52) U.S. Cl.
CPC ............... *G01R 27/08* (2013.01); *H04L 12/10* (2013.01); *G06F 1/26* (2013.01)

(58) Field of Classification Search
CPC ............ G01R 27/08; H04L 12/10; G06F 1/26
USPC .......................................... 324/691, 525, 713
See application file for complete search history.

(56) References Cited

U.S. PATENT DOCUMENTS

| | | | | |
|---|---|---|---|---|
| 7,711,967 | B2 * | 5/2010 | Woo ........................ | G06F 1/266 340/12.36 |
| 7,996,166 | B2 | 8/2011 | De La Torre Vega et al. | |
| 8,552,749 | B2 * | 10/2013 | Heath ..................... | H04L 12/10 324/691 |
| 2006/0164775 | A1 | 7/2006 | Stineman, Jr. et al. | |
| 2006/0242458 | A1 | 10/2006 | Feldman et al. | |
| 2008/0252307 | A1 | 10/2008 | Schindler | |

OTHER PUBLICATIONS

IEEE 802.3af "IEEE Standard for Information Technology Part 3: Carrier Sense Multiple Access With Collision Detection (CSMA/DC) Access Method and Physical Layer Specifications", Jun. 2003, pp. 1-132.

* cited by examiner

*Primary Examiner* — Amy He
(74) *Attorney, Agent, or Firm* — Allen, Dyer, Doppelt, Milbrath & Gilchrist, P.A.

(57) ABSTRACT

PDs that can be supplied through the LAN line are discriminated from PDs that cannot be so supplied as a function of the resistance of the supply line and of the voltage drop caused by nonlinear elements in series therewith. The values of these two parameters are estimated by applying two distinct voltages to the supply terminals of the LAN line and sensing the relative steady-state currents absorbed by the power supply line, and by processing voltage and current values for estimating the resistance of the line and the voltage drop caused by nonlinear elements connected in series therewith.

19 Claims, 5 Drawing Sheets

METHOD OF DISCRIMINATION OF A DEVICE AS POWERABLE THROUGH A LAN LINE AND DEVICE FOR ESTIMATING ELECTRIC PARAMETERS OF A LAN LINE

FIELD OF THE INVENTION

This invention relates in general to "Power over Ethernet" techniques, and, more particularly, to a method of recognizing a device as powerable through a LAN line that is based on the assessment of certain electrical parameters of the LAN line, and to a related device for estimating these electrical parameters.

BACKGROUND OF THE INVENTION

Power over Ethernet (PoE) is a technology that permits the powering of appliances through the same cable that connects them to a LAN. In a PoE network there is essentially a Power Sourcing Equipment (PSE) that is capable of supplying a Powered Device (PD), that may be, for instance, a phone, a webcam, or any other device that is connectable to the LAN. The PSE supplies power to the PD devices connected to respective sockets through a dedicated pair of insulating wires of the connecting cable. In particular, the PSE verifies whether a PD is connected to a LAN line, and monitors the current delivered to the LAN line of the PD continuously. If the PD is disconnected, the PSEs stop the application of the DC supply voltage to the LAN line.

The standard specifications that rule this technique of powering devices contemplate the possibility for the PDs connected to the LAN of communicating to the PSE the power that should be supplied to them for a correct functioning.

In order to verify whether a valid PD is connected or not to an output port of the PSE, the PoE transmission standard that at present is the IEEE 802.3af, contemplates that any connectable PD be provided with a "signature element," that may be a dedicated circuit with a certain impedance connected between the power supply terminals of the PD. When a new PD is connected to a respective point of the PSE, the PSE carries out an interrogation routine for reading the signature element. At the end of the interrogation routine, if validly identified, the newly connected PD is powered by the PSE.

The standard proposes that the PSE monitor the connection to a PoE supplied PD for verifying whether or not it has been disconnected, and when so, the PSE stops the provision of a supply voltage to the respective line of the LAN, in order to prevent application of a relatively large DC voltage to an open pair of insulated wires of the LAN line.

The procedures for recognizing a valid PD are normally carried out by measuring the resistance seen across the terminals through which the PSE supplies the LAN line, for example by applying a voltage across the pair of power supply conductors of the LAN line and measuring the current absorbed, or by forcing a current and sensing the voltage.

Unfortunately, by using these known recognition procedures, it happens sometimes that a valid PD may be incorrectly recognized as invalid, or vice versa.

SUMMARY OF THE INVENTION

Investigations carried out by the applicants have revealed that such erroneous recognitions may be due to the fact that it is simply not sufficient to measure the resistance of the power supply line at the PSE outlet for correctly identifying a valid PD, by evaluating two points of the voltage-current characteristic. Often, nonlinear elements may be connected to the line that may cause errors in the determination of the line resistance such to impede a correct identification of a PD as valid or not.

According to a first embodiment of the method of this disclosure, PDs that may be supplied through the LAN line are discriminated from PDs that may not be so supplied as a function of the resistance of the supply line and the voltage drop (Vdrop) caused by nonlinear elements in series therewith. The values of these two parameters are estimated by applying two distinct voltages to the supply terminals of the LAN line and sensing the relative steady-state currents absorbed by the power supply line, and by processing voltage and current values for estimating the resistance (Rdet) of the line and the voltage drop caused by nonlinear elements connected in series therewith.

According to an alternative embodiment of this disclosure, a third voltage is applied to the line and a third steady-state current absorbed by the line is sensed and from these voltage and current values an error term that represents the linearity of the voltage-current characteristic of the electric line is obtained. The result of the test for deciding whether the PD is powerable through the LAN line is made to depend also from this error term.

According to a further embodiment, the capacitance of the line is also estimated and a decision of whether or not the PD is powerable through the LAN line is also based upon the estimated capacitance value.

The disclosure further provides a device for estimating the above-mentioned electrical parameters of a LAN line, that are used according to the discrimination method of this disclosure for reliably recognizing PD that can be powered through the LAN line.

DETAILED DESCRIPTION OF THE PREFERRED EMBODIMENTS

Figure 1:
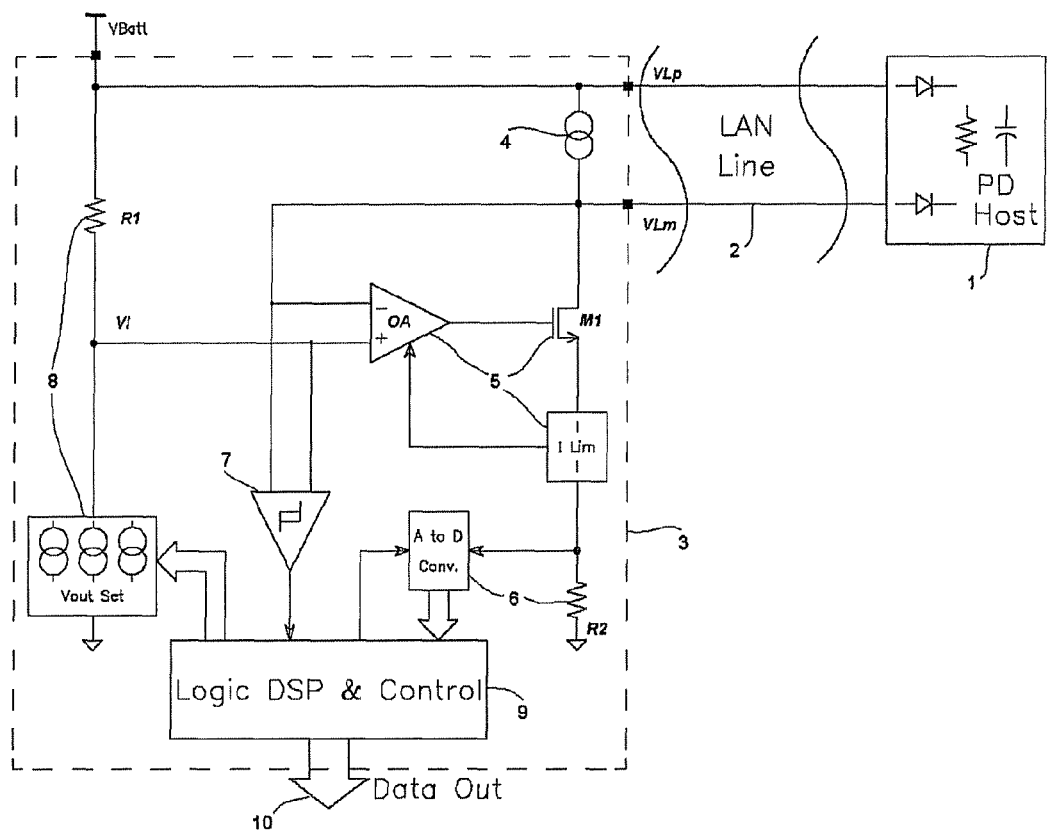
FIG. 1 illustrates an embodiment of the device of this disclosure for estimating electrical parameters of a LAN line.

An embodiment of a device for estimating values of electrical parameters of a supply line of a LAN network for implementing the method of this disclosure is depicted in FIG. 1.

A PD connected to a LAN line is recognized as powerable or not by a PSE, according to a PoE technique, by measuring the resistance Rdet seen from the supply terminals VLp, VLm of the LAN line. This is performed by driving the two supply conducting wires of the LAN line with a first voltage V1, and sensing a first steady-state current IL1 absorbed by the supply line, then powering the line with a second voltage V2, and sensing a second steady-state current IL2 absorbed by the line. Thus, the resistance Rdet seen from the terminals is estimated through the following formula:

$$R\det = \frac{V1-V2}{IL1-IL2}$$

and the voltage drop Vdrop eventually due to nonlinear elements connected in series with the power supply line is given by one of the following equations:

Vdrop=V1−Rdet*IL1 or Vdrop=V2−Rdet*IL2.

The calculated parameters Vdrop and Rdet are compared with pre-established reference intervals defined by specifications for establishing whether the connected PD is powerable through the LAN network or not. The specifications IEEE 803.af set a validity range for Rdet, but it would be desirable and is likely that, in the future, the specifications may set a validity range also for Vdrop, such to reduce the probability that the PSE is wrongly recognized as powerable to a PD that is non compliant with the specifications, or vice versa. At present, specifications set a threshold current that may be absorbed by the power supply lines of the LAN.

According to another embodiment of the method of this disclosure, the current that circulates in a LAN line, when the largest of the voltages V1 and V2 is applied, is compared with the threshold value. If this threshold value is exceeded, the PD is recognized as not compliant with the PoE specifications and may not be powered through the LAN line.

In order to make the discrimination between PD powerable and not powerable by the PSE more reliable according to another embodiment of the method of this disclosure, a third supply voltage V3 is applied and the steady-state current IL3 absorbed by the line is measured. An error term ε is estimated according to the following formula:

$$IL3 \pm \varepsilon = \frac{V3 - Vdrop}{R\det}.$$

Any skilled person will immediately notice that if the voltage-current characteristic of the supply line of a LAN line were linear, the error term ε would be null. In general, if the line has a nonlinear characteristic, thus this error term is nonnull. Therefore, its value indicates how much the voltage-current characteristic of the line is nonlinear.

This implies that the estimated value of the resistance Rdet may depend on the supply voltages used for carrying out the estimation. In practice, relatively large values of ε may mean that the value of Rdet calculated for a certain PD may fit in the specifications range because of the voltages that have been used for carrying out the estimation, and different voltages used for the assessment may result in obtainment of a value of Rdet not compliant with specifications.

Even if present specifications do not contemplate the evaluation of this error term for deciding whether a PD is powerable or not using the PoE technology, it is highly desirable and probable that the standard specifications will be updated for making the identification of PDs powerable with the PoE technique more reliable.

The device of FIG. 1 provides to a control system of the power that may be supplied to a LAN line (2) and to a PD Host (1) connected thereto that may utilize more information than known systems provide during the so-called "detection phase". More precisely, according to this embodiment, the device of FIG. 1 provides the values of the resistance component of the line Rdet seen from the terminals VLp and VLm, and the voltage drop Vdrop due to nonlinear elements that may be connected to the line, such as, for example, rectifying diodes that are commonly included in PDs.

According to another and preferred embodiment, the device also provides an error term ε and/or the capacitance of a connected PD, that may be sensed over a wide range.

The system carries out these estimations of electrical parameters of the power supply line respecting the constraints of the international specifications IEEE 803.af (that set a threshold voltage Vmax=10V and a threshold current Imax=5 mA).

Figure 2:
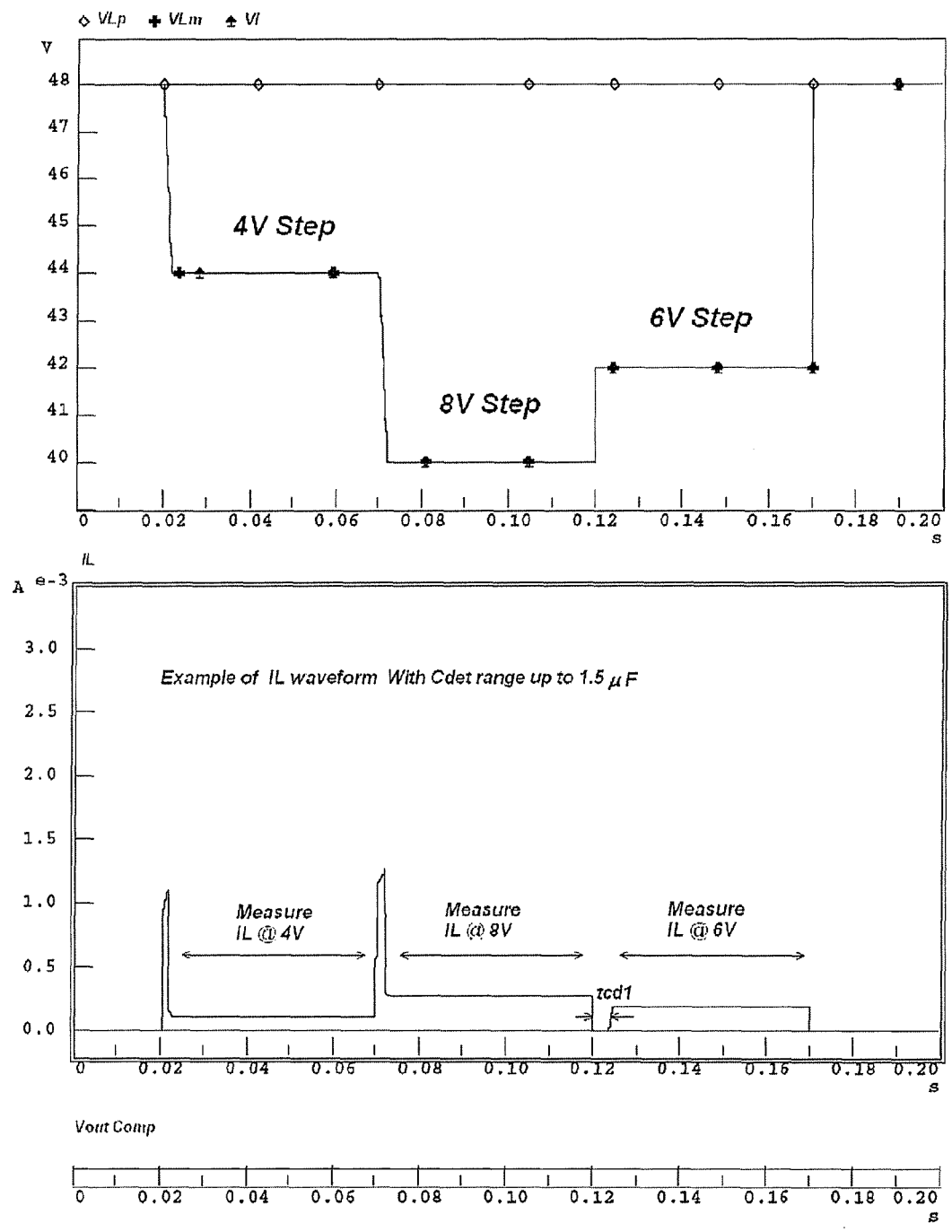
FIGS. 2 and 3 depict waveforms of the supply voltage of the LAN line and of the absorbed current for the device of FIG. 1 according to an embodiment of a method of this disclosure, for a LAN line with a capacitance smaller than and larger than 1.5 µF, respectively.
Figure 3:
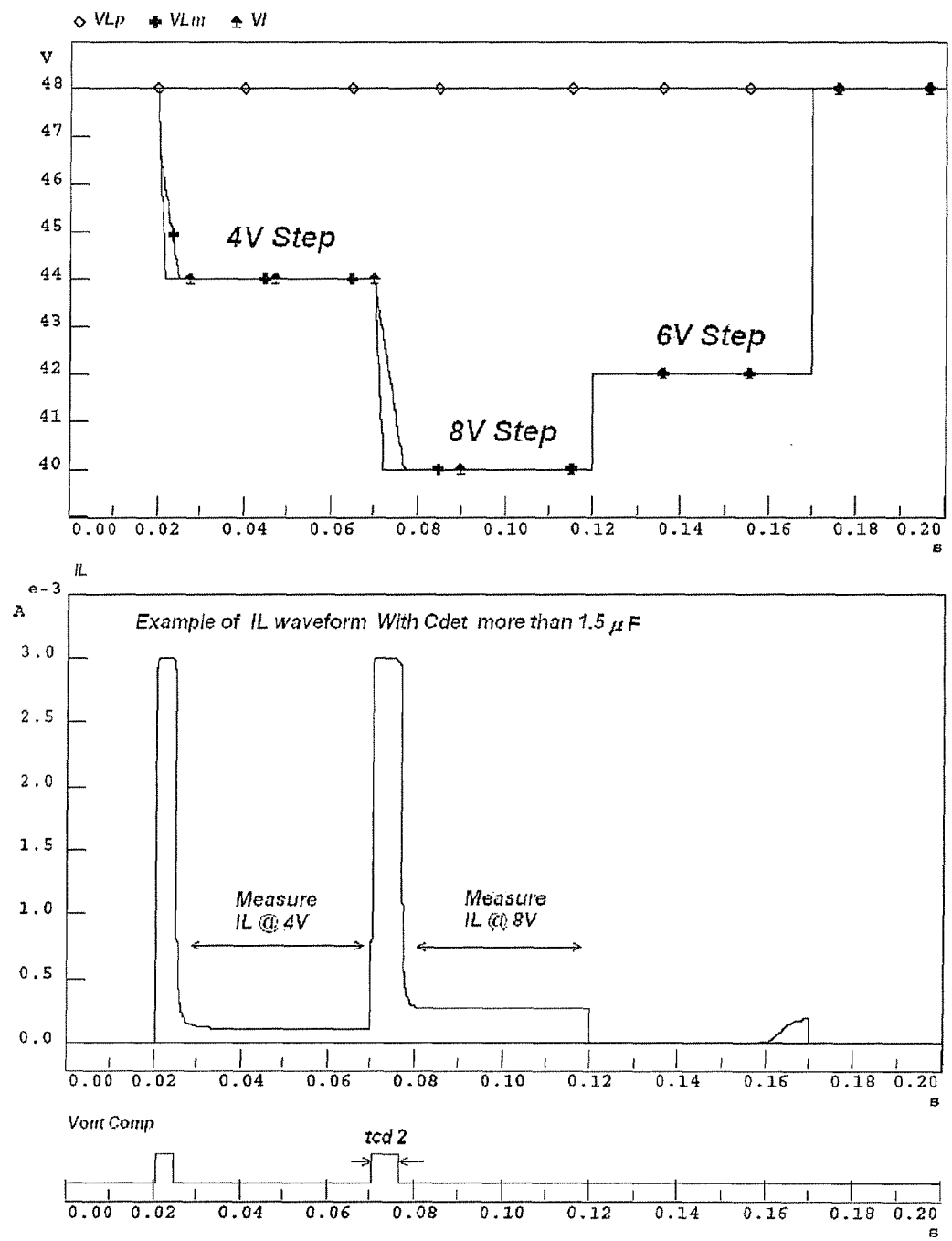

According to an alternative embodiment, during a "detection phase", the LAN line is supplied at three different voltages over three consecutive steps. As shown in FIGS. 2 and 3, on the nodes VLp and VLm a first voltage of 4V is supplied for 50 ms, then a second voltage of 8V is supplied for 50 ms, and finally a third voltage, smaller than the second voltage but larger than the first voltage, of 6V is supplied for 50 ms, is applied.

Of course, these voltages may have different values provided they comply with the constraints of the standard specifications, that contemplate supply voltages of between 2.8V and 10V and voltage steps of at least 1V.

The voltage step switchings generate high frequency harmonics that may disturb the normal transmission of data over the LAN line. For this reason, the device of FIG. 1 should preferably be provided with a circuit (not shown) that limits the slope of the switching edges to the different supply voltages.

The sequence of different supply voltages applied to the LAN line on which a detection routine is performed, is controlled by the digital block 9, LOGIC DSP & CONTROL, that acts on the block VOUT SET by sequentially enabling constant current generators that produce on the resistor R1 the desired voltages of 4V, 8V and 6V. In practice, the block VOUT SET forms with the resistor R1 a controlled voltage generator 8 of one of three pre-established supply voltages.

The node VI is connected to the non inverting input of the operational amplifier OA of the block 5. The inverting input of the amplifier is connected to the terminal VLm, that is to the "low side" terminal of the line, for replicating the voltage VI on the node VLm.

The output of the operational amplifier controls the MOS M1 that drives the current absorbed by the line. The block Ilim is a current limiter, that limits the current that may be absorbed by the line up to a pre-established threshold value, compatible with specifications. For example, such a current threshold may be fixed at 3 mA, that is compatible with specifications of the standard IEEE 803.af.

The "high" side VLp of the line is connected to the positive supply terminal Vbatt. The 20 µA current generator 4 establishes the working point of the system in case of an open line (absence of the PD HOST). The block LOGIC DSP & CONTROL subtracts this current from the value of the current Il sensed by the block 6.

The block 5 replicates on the node VLm the voltage on the node VI, thus it behaves as a voltage generator when the line current is below the maximum current Ilim. For larger currents, the circuit elements 5 act as a current generator of a current Ilim=3 mA. The current absorbed by the line is forced through the resistor R2 by way of the transistor M1 and the block Ilim. The voltage drop on the resistor R2 is therefore proportional to the current absorbed by the line.

The circuit elements 6, that is the sense resistor R2 and the analog-to-digital converter A TO D CONV, provide a digital signal representative of the current absorbed by the line to the processing block 9 LOGIC DSP & CONTROL. The activation of the monitoring/measurement of the current by the converter is managed by the same block LOGIC DSP & CONTROL.

Between the input terminal VI and the output terminal VLm, there is a comparator 7 that provides to the block LOGIC DSP & CONTROL a flag signal for discriminating when the block 5 is functioning as a voltage generator rather than as a current generator. When it functions as a voltage generator, the two nodes VI and VLm are practically at the same potential, and the output of the comparator presents a logically null flag 0, while when it functions as a current generator the two nodes are at sensibly different potentials and the comparator outputs an active flag 1.

The digital block LOGIC DSP & CONTROL that controls the state of the above described analog blocks, receives from them the information when activated, implements the assessment method, and produces on the output bus DATA OUT at least the values of the resistance Rdet and of the voltage drop Vdrop accountable to nonlinear loads coupled to the power supply line of the LAN connection.

Preferably, it also produces on the output bus DATA OUT information on the degree of nonlinearity of the supply line load and the value of the capacitance Cdet over a relatively wide variability range. This information may be stored and used by a controller of the powering of the LAN lines coupled to respective ports of the PSE.

The present standard IEEE 803.af sets discrimination resistance values of Rdet and of capacitance Cdet of PD:
Rdet is valid if within the interval from 19 kΩ to 29.5 kΩ and invalid if smaller than 15 kΩ or larger than 33 kΩ;
Cdet is valid if smaller than 150 nF and invalid if larger than 10 μF. For intermediate capacitance values, other criteria are used to decide whether or not the PD should be supplied. However, there are PDs produced before the introduction of the standard specifications that can be supplied through a LAN line though having a Cdet value larger than the maximum value established by the standard.

FIGS. 2 and 3 are waveforms that illustrate the functioning of the device of FIG. 1 with two different kinds of PDs: the PD used for obtaining the diagrams of FIG. 2 is compatible with the IEEE specifications 802.3af, with Rdet=25 kΩ and Cdet=150 nF; the PD used for the diagrams of FIG. 3 is a pre-standard device with Rdet=25 kΩ and Cd=5 μF.

FIG. 2 shows waveforms obtained with a standard compliant PD having a capacitance Cdet smaller than 1.5 μF. The system supplies the power supply line at a first voltage, for example 4V, determining a steady-state current absorption IL4 that depends on the electrical characteristics of the connected PD. The current IL4 flows through the sensing resistor R2, producing a voltage drop proportional to the current itself.

The analog-to-digital converter A TO D CONV converts the voltage on the sensing resistor into a digital signal and provides it to the control logic LOGIC DSP & CONTROL, that digitally filters and stores it.

Preferably, the measure of the value of IL4 starts with a delay of about 3 ms from the beginning of the voltage step for avoiding transient disturbances.

After 50 ms, that is a time interval long enough to allow the analog-to-digital converter to convert the steady-state current value, a second supply voltage of 8V is applied and the steady-state current level IL8 is measured anew and stored.

From the applied voltages and the sensed steady-state current, the block LOGIC DSP & CONTROL determines and stores the resistance value Rdet of the line and the voltage drop Vdrop due to nonlinear load components that may be present.

According to a preferred embodiment, the control logic supplies the line at a third voltage of 6V and, similarly, stores the respective steady-state current value IL6.

As already described above, the control logic calculates an error term ε that gives an indication of the degree of nonlinearity of the voltage-current characteristic, according to the following equation:

$$IL6 \pm \varepsilon = \frac{6V - Vdrop}{R\det}.$$

As will be apparent to any skilled person, the supply voltages that are stepwise applied during the test routine may differ from those of the above described example, provided that they are within the ranges set by the standard specifications of the PoE technology. At present the standard specifications contemplate voltages comprised between 2.8V and 10V with a difference of 1V between different voltage levels.

Any skilled person will recognize that it is not mandatory that the optionally applied third voltage be comprised between the first and the second voltages; for example, it is possible to use a second voltage of 6V and a third voltage of 8V. Another parameter that is useful for identifying a valid PD is the capacitance Cdet of the PD connected in parallel to the line resistance Rdet.

According to a further embodiment, the capacitance Cdet of the PD is calculated using two different formulas depending on whether the current limiter Ilim is limiting or not the current absorbed by the line.

Let us consider first the case in which the current absorbed by the line is smaller than Ilim when a voltage of 8V is applied. When the device supplies the line at 8V, the capacitance Cdet of the PD, that is in parallel with the resistance Rdet seen from the terminal VLm and VLp, is rapidly charged at the voltage 8V-Vdrop (having neglected the resistance of the LAN line). Switching the applied supply voltage from 8V to 6V, the current absorbed by the line is null as long as the capacitance Cdet discharges on the resistance Rdet from the voltage 8V-Vdrop to the voltage 6V-Vdrop. Thereafter, the current may increase up to the value (6V-Vdrop)/Rdet.

In order to estimate the capacitance Cdet, the time interval tcd1 from the beginning of the step at 6V to the instant in which the current absorbed by the line reaches the steady-state level IL4, when the line is supplied at 4V, is measured.

The control logic estimates the capacitance value Cdet as a function of this time interval, of the resistance Rdet, of the voltage drop Vdrop, and of the second (8V) and third voltage (6V) using the following formula:

$$C\det = -\frac{tcd1}{R\det} \cdot \frac{1}{\ln\frac{6V - Vdrop}{8V - Vdrop}}$$

FIG. 2 depicts graphs of the supply voltage and of the current absorbed by the line for a capacitance value smaller than 1.5 μF.

Figure 4:
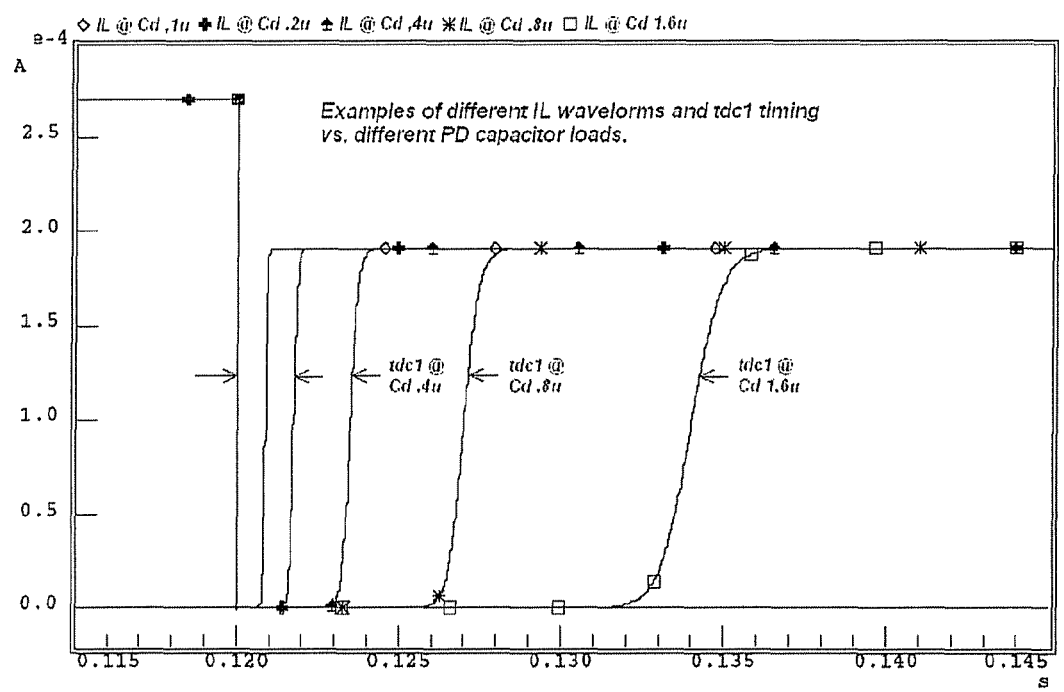
FIG. 4 depicts waveforms of the current absorbed by the LAN line obtained by switching the supply voltage from 8V to 6V with the device of FIG. 1.

FIG. 4 depicts various waveforms of the current absorbed by the line based upon the voltage step from 8V to 6V with a line resistance Rdet of 25 kΩ and for different values of capacitance Cdet.

If the capacitance Cdet is relatively large (larger than 1.5 μF, as often in the case in a pre-standard) and a voltage of 8V is applied, the current absorbed by the line exceeds the threshold value imposed by specifications, therefore the current limiter Ilim limits the current absorbed by the line up to this threshold value. In this case, the operational amplifier OA with the driver M1 and the current limiter Ilim, during transitions from 0V to 4V and during the transition from the step 4V to 8V, acts for a certain time (that is a function of the value of Ilim and of Cdet) as a current generator that draws a constant current from the line. As depicted in FIG. 3, the voltage on the node VLm may not instantaneously follow the voltage VI generated by the block V$_{OUT\ SET}$ on the resistor R1.

The comparator 7 senses when the voltage applied on the line is larger than that generated on the resistor R1 and provides to the digital block 9 an active flag. The signal output by the comparator 7 delays the beginning of the 3 ms interval that starts if the flag is logically low, in order to prevent significant errors in measuring the steady-state values of IL4 and IL8, in the presence of longer lasting transients.

According to an embodiment, the time tdc2 in which the output of the comparator 7 remains at a high logic level, because of the switching from the first supply voltage (4V) to the second voltage (8V), is measured, and the capacitance Cdet of the PD as a function of tcd2, Rdet, Vdrop and of the two voltage levels (4V and 8V) is calculated with the following formula:

$$C\ \text{det} = -\frac{tcd2}{R\ \text{det}} \cdot \frac{1}{\ln\frac{R\ \text{det} \cdot I\text{lim} - (4V - V\text{drop})}{R\ \text{det} \cdot I\text{lim} - (8V - V\text{drop})}}$$

If the steady-state current flowing through the resistance Rdet (that is IL8) is negligible in respect to the current Ilim, then the previous formula may be simplified as follows:

$$C\ \text{det} = -\frac{tcd2 \cdot I\text{lim}}{8V - 4V}$$

Figure 5:
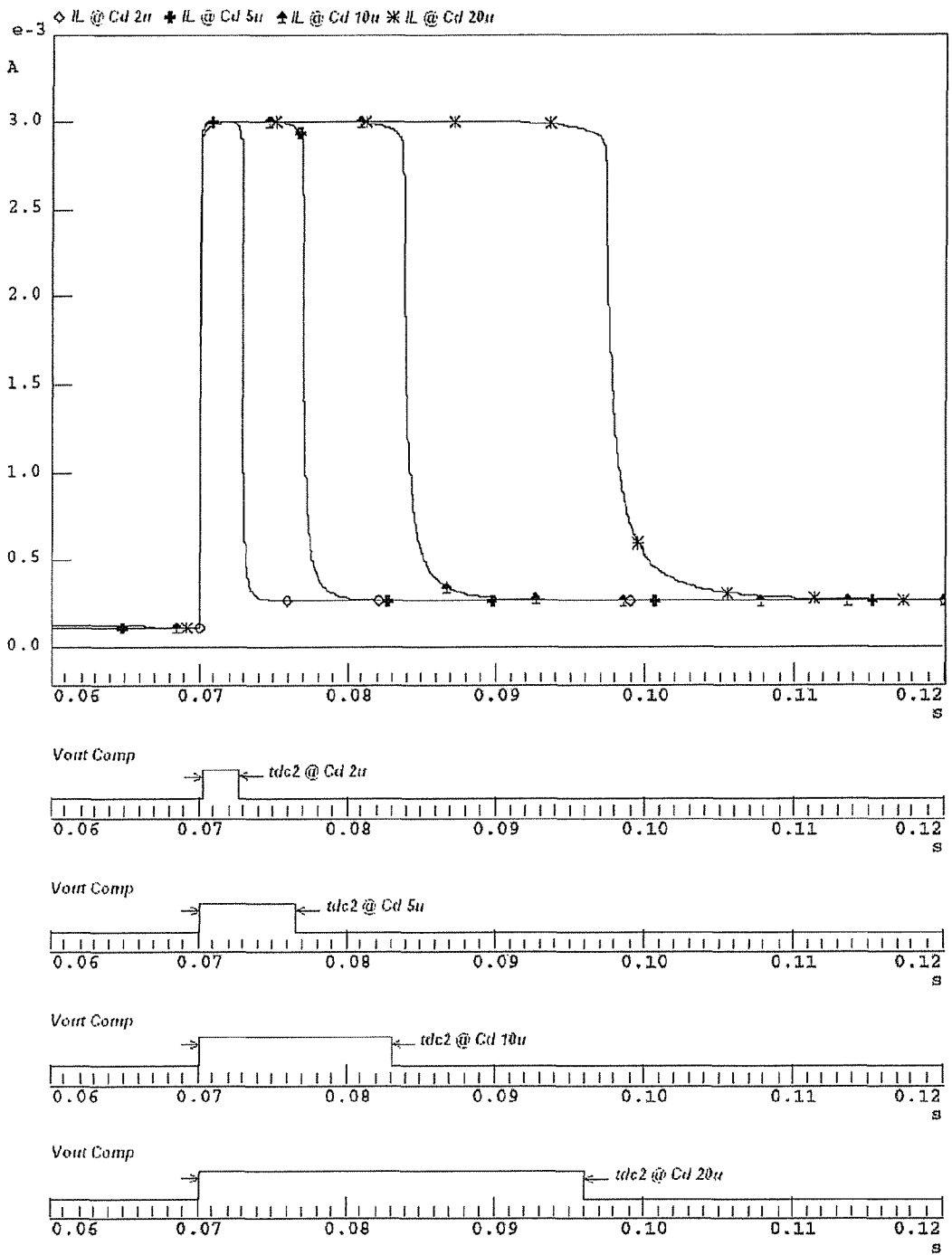
FIG. 5 depicts waveforms of the current absorbed by the LAN line and output waveforms of the comparator of the device of FIG. 1 obtained by switching the supply voltage from 4V to 8V.

FIG. 5 depicts different waveforms of absorbed currents and the relative flags output by the comparator 7 for voltage switchings from 4V to 8V, obtained with different capacitance values Cdet and with a resistance Rdet of 25 kΩ (and thus for different values of tdc2).

The novel system of this disclosure is capable of providing during a "detection phase" and exhaustive amount of significant data for recognizing the state of the line and of a PD eventually connected to it. The electrical data obtained allows the control system of the power supplied to the LAN line to decide correctly, even with desirably overhauled standard specifications requiring more details of the electrical characteristics of the line to be powered (for example the new international specifications IEEE803.at that is being discussed and that contemplates powerable devices of up to 30 W rating and a full compatibility with pre-standard PDs). It is evident that the supply voltages may be immediately adapted for being compliant with future PoE specifications.

This provides for a practically absolute reliability of the assessment of the presence of a valid PD connected to the line by virtue of the different verifications that are carried out.

Systems realized according to a preferred embodiment are also capable of communicating the value of the capacitive component of the line, in addition to an accurate value of the resistive components. This allows the system to recognize and validate pre-standard PDs, and could allow discrimination in a detection phase PDs that require different approaches from the controller of the powering of the LAN line (i.e. PD that require powers larger than the threshold permitted by the present standard, PD that require 2 or 4 twisted wires and so on).

Verifying the voltage drop of the nonlinear elements of the PD enhances the reliability of the decision on whether to power a valid remote PD or not.

That which is claimed:

1. A method of recognizing a device as being powerable through a local area network (LAN) line coupled thereto based upon electrical parameters seen from first and second terminals of the LAN line comprising:
    applying a first voltage across the first and second terminals for a first time interval and sensing a first steady-state current;
    applying a second voltage different than the first voltage across the first and second terminals for a second time interval and sensing a second steady-state current;
    estimating a resistance of the LAN line based upon the first and second voltages, and the first and second steady-state currents; and
    switching a supply voltage of the LAN line from the second voltage to a third voltage and sensing a third steady-state current;
    estimating a capacitance of the LAN line seen from the first and second terminals, based upon the third steady-state current failing to reach a threshold, by at least sensing a duration of a time interval starting from the switching during which the third steady-state current is smaller than the first steady-state current, and estimating the capacitance based upon the time interval, the resistance of the LAN line, a voltage drop across a load coupled to the LAN line, and the second and third voltages; and
    recognizing the device as being powerable through the LAN line based upon the resistance of the LAN line, the capacitance of the LAN line, and the voltage drop across the load coupled to the LAN line.

2. The method of claim 1, wherein the resistance is estimated as a ratio of a difference between the first and second voltages and a difference between the first and second steady-state currents; and wherein the voltage drop across the load is estimated as a difference between one of the first and second voltages and a product of one of the first and second currents with the resistance of the LAN line.

3. The method of claim 1, further comprising applying a fourth voltage on the first and second terminals for a fourth time interval and sensing a fourth steady-state current;
    further comprising estimating an error term representing a degree of nonlinearity of a voltage-current characteristic of the LAN line based upon the fourth voltage, the fourth steady-state current, the resistance of the LAN line, and the voltage drop across the load; and wherein the device is also recognized as being powerable through the LAN line based upon the error term.

4. The method of claim 3, wherein the error term is estimated as a difference between the fourth steady-state current and a ratio of a difference between the fourth voltage and the voltage drop across the load and the resistance of the LAN line.

5. The method of claim 3, wherein the fourth voltage is larger than the second voltage; and wherein the first voltage is smaller than the second voltage.

6. The method of claim 1, further comprising recognizing the device as not being powerable through the LAN line based upon at least one of the first and second steady-state currents exceeding a threshold current.

7. A method of recognizing a device as being powerable through a local area network (LAN) line coupled thereto based upon electrical parameters seen from first and second terminals of the LAN line comprising:

applying a first voltage across the first and second terminals for a first time interval and sensing a first steady-state current;

applying a second voltage different than the first voltage across the first and second terminals for a second time interval and sensing a second steady-state current;

estimating a resistance of the LAN line based upon the first and second voltages, and the first and second steady-state currents;

switching from the first voltage to the second voltage, verifying whether a transient current reaches a threshold current, limiting the transient current at the threshold current, generating an active flag, and estimating the capacitance of the line seen from the first and second terminals, based upon the transient current reaching the threshold level by at least sensing a duration of a time interval, starting from the switching, during which the flag is active, and, estimating the capacitance based upon the time interval, the resistance of the LAN line, the first and second voltages, the threshold current, and a voltage across a load coupled to the LAN line; and recognizing the device as being powerable through the LAN line based upon the resistance of the LAN line, the capacitance of the LAN line, and the voltage drop across the load coupled to the LAN line.

8. The method of claim 7, wherein the resistance is estimated as a ratio of a difference between the first and second voltages and a difference between the first and second steady-state currents; and wherein the voltage drop across the load is estimated as a difference between one of the first and second voltages and a product of one of the first and second currents with the resistance of the LAN line.

9. The method of claim 7, further comprising applying a fourth voltage on the first and second terminals for a fourth time interval and sensing a fourth steady-state current;

further comprising estimating an error term representing a degree of nonlinearity of a voltage-current characteristic of the LAN line based upon the fourth voltage, the fourth steady-state current, the resistance of the LAN line, and the voltage drop across the load; and wherein the device is also recognized as being powerable through the LAN line based upon the error term.

10. The method of claim 9, wherein the error term is estimated as a difference between the fourth steady-state current and a ratio of a difference between the fourth voltage and the voltage drop across the load and the resistance of the LAN line.

11. The method of claim 9, wherein the fourth voltage is larger than the second voltage; and wherein the first voltage is smaller than the second voltage.

12. The method of claim 7, further comprising recognizing the device as not being powerable through the LAN line based upon at least one of the first and second steady-state currents exceeding a threshold current.

13. A method of recognizing a device as being powerable through a local area network (LAN) line coupled thereto based upon electrical parameters seen from first and second terminals of the LAN line comprising:

applying a first voltage across the first and second terminals for a first time interval and sensing a first steady-state current;

applying a second voltage different than the first voltage across the first and second terminals for a second time interval and sensing a second steady-state current;

estimating a resistance of the LAN line based upon the first and second voltages, and the first and second steady-state currents;

switching a supply voltage of the LAN line from the second voltage to a third voltage and sensing a third steady-state current;

estimating a capacitance of the LAN line seen between the first and second terminals, based upon the third steady-state current failing to reach a threshold; and recognizing the device as being powerable through the LAN line based upon the resistance of the LAN line, a voltage drop across a load coupled to the LAN line, and the capacitance of the LAN line.

14. The method of claim 13, wherein the resistance is estimated as a ratio of a difference between the first and second voltages and a difference between the first and second steady-state currents; and wherein the voltage drop across the load is estimated as a difference between one of the first and second voltages and a product of one of the first and second currents with the resistance of the LAN line.

15. A device to be coupled to first and second terminals of a local area network (LAN) line comprising:

a generator configured to generate at least first and second supply voltages;

a buffer stage configured to replicate the first supply voltage on the first and second terminals for a first time interval;

a current sensor configured to generate a corresponding digital signal representative of a first current absorbed by the LAN line as the first supply voltage is replicated on the first and second terminals;

said buffer stage also configured to replicate the second supply voltage on the first and second terminals for a second time interval;

said current sensor also configured to generate a corresponding digital signal representative of a second current absorbed by the LAN line as the second supply voltage is replicated on the first and second terminals;

control circuitry configured to control the generator and to estimate a resistance of the LAN line based upon the first and second voltages, and the first and second steady-state currents;

said control circuitry also configured to recognize the device as being powerable through the LAN line based upon the resistance of the LAN line and a voltage drop across a load coupled to the LAN line.

16. The device of claim 15, wherein said current sensor comprises a circuit configured for limiting at least one of the first and second currents absorbed by the LAN line to a threshold current; and wherein said control circuitry is further configured to recognize the device as not being powerable through the LAN line based upon the first and second currents exceeding the threshold current.

17. The device of claim 15, further comprising a current generator configured to fix a first bias current of said current sensor.

18. The device of claim 15, wherein said generator is also configured to generate a third voltage; and wherein said buffer stage is also configured to replicate the third voltage on the first and second terminals for a third time interval; wherein said current sensor is also configured to generate a corresponding digital signal representative of a third current absorbed by the LAN line as the third supply voltage is replicated on the first and second terminals; and wherein said control circuitry is also configured for estimating a capacitance of the LAN line seen from the first and second terminals, based upon the third current absorbed by the LAN line failing to reach a threshold, by at least sensing a duration of a time interval starting from the switching during which the third current is smaller than the first current, and estimating the capacitance based upon the time interval, the resistance of the LAN line, the voltage drop across the load, and the second and third voltages; and wherein said control circuitry is also configured for recognizing the device as being powerable through the LAN line based upon the capacitance.

19. The device of claim 15, further comprising a circuit for limiting a slope of switching edges of first and second voltages generated by the generator.

* * * * *